CIRCUIT FOR LOGARITHMICALLY COMPRESSING A LARGE
DYNAMIC RANGE RF SIGNAL
Filed Sept. 29, 1964
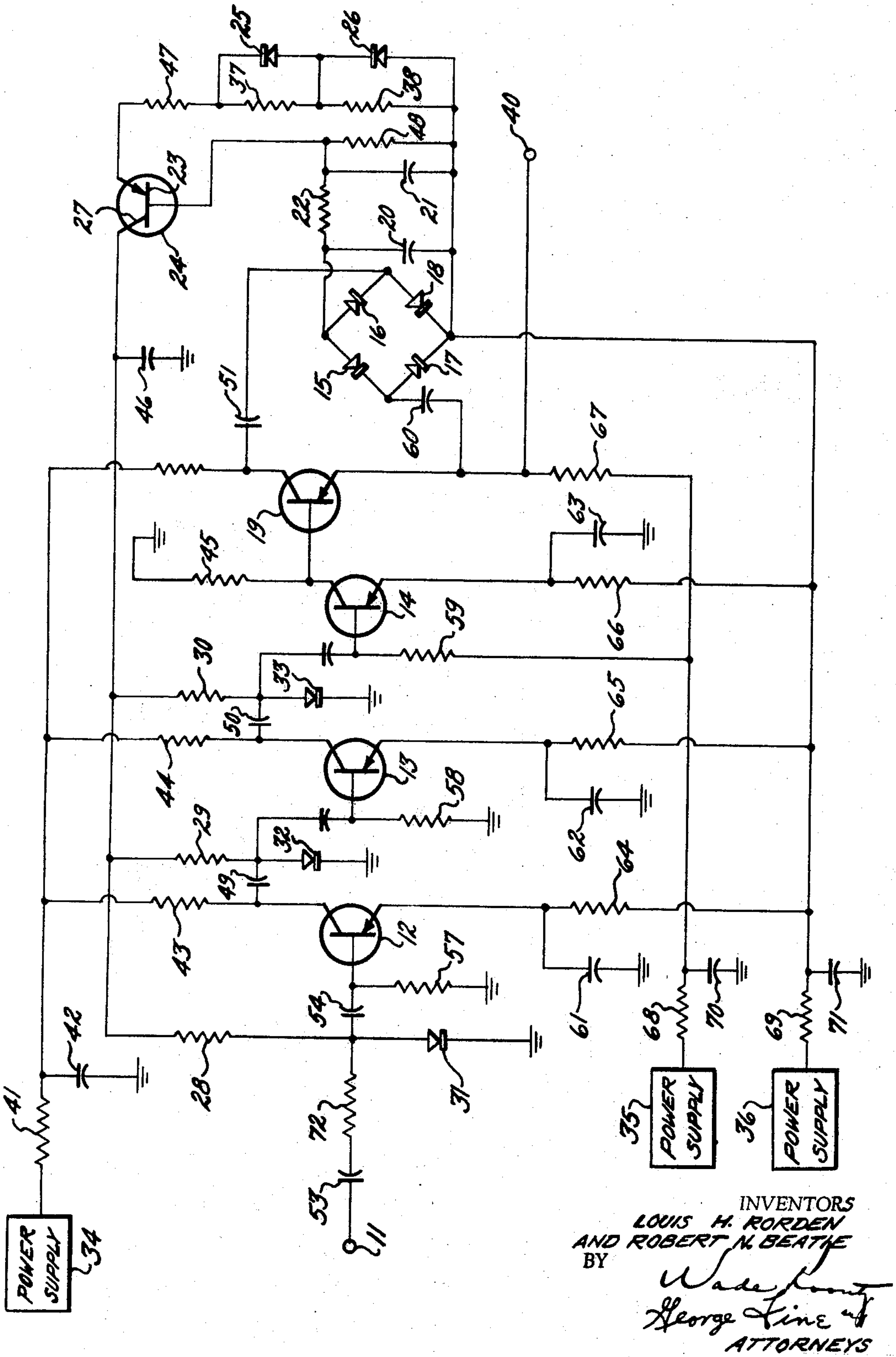
INVENTORS
LOUIS H. RORDEN
AND ROBERT N. BEATTIE
BY
Wade Koontz
George Fine
ATTORNEYS

United States Patent Office 3,361,975

Patented Jan. 2, 1968

3,361,975

CIRCUIT FOR LOGARITHMICALLY COMPRESSING A LARGE DYNAMIC RANGE RF SIGNAL

Louis H. Rorden, Menlo Park, and Robert N. Beatie, Los Altos, Calif., assignors to the United States of America as represented by the Secretary of the Air Force

Filed Sept. 29, 1964, Ser. No. 400,291

3 Claims. (Cl. 325—411)

This invention relates to electronic compression circuit and more particularly to a compression circuit that logarithmically compresses a large dynamic range signal.

An object of this invention is to provide a circuit for compressing an RF signal of large dynamic range.

Another object is to provide a compression circuit having a logarithmic output.

Other objects and features of this invention will become more apparent by reference to the following description when taken in conjunction with the accompanying drawing which shows a circuit diagram of an embodiment of the invention which logarithmically compresses large dynamic range to narrow band signals to a form suitable for telemetry purposes.

Referring to the drawing, an RF signal varying in amplitude is fed into terminal 11 and is amplified by transistors 12, 13, and 14. The amplified signal is then fed by way of transistor 19 to a bridge network incorporating diodes 15, 16, 17, and 18. The bridge network detects the envelope thereof. The detected signal is filtered by the low pass network comprising capacitors 20 and 21 and resistor 22. The filtered signal is then applied to base 23 of transistor 24 which utilizes diodes 25 and 26 and resistors 37 and 38 in the common emitter section to obtain an approximation to a logarithmic envelope response. The varying voltage appearing at collector 27 is applied to resistors 28, 29, and 30 to provide bias current to forward bias diode junction diodes 31, 32 and 33 respectively so that their impedance drops with increasing voltage and the gains of their respective transistor amplifiers 12, 13 and 14 are reduced. The output is taken at terminal 40. The requisite voltages are provided by way of power supplies 34, 35 and 36. With this circuit, a signal with 80 db signal range introduced at terminal 11 is logarithmically compressed to 20 db at output terminal 40. This circuit also offers temperature independence to a first approximation and a reduction of low frequency control transients, allowing faster response for a given center frequency.

What is claimed is:

1. A circuit for compressing a large dynamic range signal comprising: means for initial amplifying the signal; means for detecting the signal; a low-pass filter network connected to the output of the detecting means; means for logarithmically amplifying the output of the filter network; and means for applying a bias factor to the initial amplifying means, the bias factor being dependent upon the output of the filter network.

2. A circuit for compressing a large dynamic range signal comprising: a first transistor amplifier having a base, emitter, and collector; a biasing resistor and a diode capacitively connected to the base of the first transistor and amplifier; a diode bridge network for detecting the signal; a low-pass filter network; a second transistor having a base, emitter, and collector wherein the base is coupled to the output of the filter network and the collector is coupled to the biasing resistor; and a network of resistors and diodes connected between the base and the emitter of the second transistor for producing an approximation to a logarithmic output.

3. A circuit for compressing a large dynamic range signal comprising: a plurality of transistor amplifiers, each having a base, emitter, and collector; a plurality of biasing resistors, one each capacitively connected to the base of each of the plurality of transistor amplifiers; a plurality of diodes, one each capacitively connected to the base of each of the plurality of transistor amplifiers; a diode bridge network for detecting the amplified signals; a low-pass filter network connected to the output of the diode bridge network; a transistor having a base, emitter, and collector wherein the base is coupled to the output of the filter network and the collector is connected to each of the plurality of biasing resistors; and a network of resistors and diodes connected between the base and the emitter of the transistor for producing an approximation to a logarithmic output.

No references cited.

KATHLEEN H. CLAFFY, *Primary Examiner.*

R. S. BELL, *Assistant Examiner.*